US009460963B2

(12) United States Patent
Wells et al.

(10) Patent No.: US 9,460,963 B2
(45) Date of Patent: Oct. 4, 2016

(54) SELF-ALIGNED CONTACTS AND METHODS OF FABRICATION

(71) Applicant: GLOBALFOUNDRIES Inc., Grand Cayman (KY)

(72) Inventors: Gabriel Padron Wells, Saratoga Springs, NY (US); Xiang Hu, Clifton Park, NY (US); Guillaume Bouche, Albany, NY (US); Andre Labonte, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 56 days.

(21) Appl. No.: 14/225,529

(22) Filed: Mar. 26, 2014

(65) Prior Publication Data
US 2015/0279738 A1 Oct. 1, 2015

(51) Int. Cl.
*H01L 21/467* (2006.01)
*H01L 21/768* (2006.01)
*H01L 29/40* (2006.01)
*H01L 21/033* (2006.01)
*H01L 21/308* (2006.01)
*H01L 29/417* (2006.01)
*H01L 27/088* (2006.01)
*H01L 21/8234* (2006.01)

(52) U.S. Cl.
CPC ..... *H01L 21/76897* (2013.01); *H01L 21/0332* (2013.01); *H01L 21/3081* (2013.01); *H01L 21/467* (2013.01); *H01L 21/823475* (2013.01); *H01L 29/401* (2013.01); *H01L 29/41783* (2013.01); *H01L 21/823431* (2013.01); *H01L 27/088* (2013.01)

(58) Field of Classification Search
CPC .......................... H01L 21/467; H01L 21/475
See application file for complete search history.

(56) References Cited

U.S. PATENT DOCUMENTS

| | | | | |
|---|---|---|---|---|
| 6,255,221 B1 * | 7/2001 | Hudson | ............. | H01L 21/31116 216/67 |
| 6,307,264 B1 * | 10/2001 | Fukumoto | ......... | G02F 1/133553 257/249 |
| 6,630,711 B2 | 10/2003 | Huang | | |
| 6,924,184 B2 * | 8/2005 | Cave | ................. | H01L 21/76802 257/E21.576 |
| 2003/0176071 A1 * | 9/2003 | Oohara | ................. | B81C 1/0019 438/707 |
| 2004/0178171 A1 | 9/2004 | Nagarajan | | |
| 2008/0305595 A1 * | 12/2008 | Kwon | ............... | H01L 21/76816 438/279 |
| 2010/0187596 A1 * | 7/2010 | Hsieh | ................ | H01L 27/11565 257/324 |
| 2013/0337624 A1 * | 12/2013 | Baiocco | ............ | H01L 29/66477 438/294 |

* cited by examiner

*Primary Examiner* — Stephen W Smoot
(74) *Attorney, Agent, or Firm* — Williams Morgan, P.C.

(57) ABSTRACT

Embodiments of the present invention provide an improved contact and method of fabrication. A dielectric layer is formed over transistor structures which include gates and source/drain regions. A first etch, which may be a reactive ion etch, is used to partially recess the dielectric layer. A second etch is then used to continue the etch of the dielectric layer to form a cavity adjacent to the gate spacers. The second etch is highly selective to the spacer material, which prevents damage to the spacers during the exposure (opening) of the source/drain regions.

17 Claims, 11 Drawing Sheets

US 9,460,963 B2

1

SELF-ALIGNED CONTACTS AND METHODS OF FABRICATION

FIELD OF THE INVENTION

The present invention relates generally to semiconductor fabrication, and more particularly, to self-aligned contacts and methods of fabrication.

BACKGROUND

As integrated circuits continue to scale downward in size, the formation of contacts for gates, sources, and drains is becoming more challenging. With fin type field effect transistors (finFETs), as with other transistor types (e.g. planar transistors), the contacts that connect the source, drain, and gate of the transistor are an important factor in the production of reliable integrated circuits with desired performance characteristics. It is therefore desirable to have improvements in the fabrication of transistors to improve the quality of the transistor contacts.

SUMMARY

Embodiments of the present invention provide an improved contact and method of fabrication. A dielectric layer is formed over transistor structures which include gates and source/drain regions. A first etch, which may be a reactive ion etch, is used to partially recess the dielectric layer. A second etch is then used to continue the etch of the dielectric layer to form a cavity adjacent to the gate spacers. The second etch is highly selective to the spacer material, which prevents damage to the spacers during the exposure (opening) of the source/drain regions.

In a first aspect, embodiments of the present invention provide a method of forming a semiconductor structure, comprising: forming a plurality of gates on a semiconductor substrate; forming a plurality of source/drain regions adjacent to the plurality of gates; forming a nitride layer over the plurality of gates; forming a dielectric layer over the nitride layer; forming a first mask layer on the dielectric layer; forming a second mask layer on the first mask layer; patterning the second mask layer; performing an etch of the first mask layer; performing a first etch of the dielectric layer to a level above the source/drain regions; and performing a second etch of the dielectric layer to expose the source/drain regions.

In a second aspect, embodiments of the present invention provide a method of forming a semiconductor structure, comprising: forming a plurality of gates on a semiconductor substrate; forming a plurality of source/drain regions adjacent to the plurality of gates; forming a nitride layer over the plurality of gates; forming a contact etch stop layer over the source/drain regions; forming a dielectric layer over the nitride layer; forming a first mask layer on the dielectric layer; forming a second mask layer on the first mask layer; patterning the second mask layer; performing an etch of the first mask layer; performing a first etch of the dielectric layer to a level above the source/drain regions; performing a second etch of the dielectric layer to expose the contact etch stop layer; and performing a third etch to expose the source/drain regions.

In a third aspect, embodiments of the present invention provide a semiconductor structure, comprising: a semiconductor substrate; a plurality of gates disposed on the semiconductor substrate; a plurality of spacers disposed adjacent to each gate of the plurality of gates; a source/drain region

2 disposed between each gate of the plurality of gates; a contact formed on at least one source/drain region and adjacent to a contact-adjacent spacer of the plurality of spacers, and wherein the contact-adjacent spacer has the same shape as a non-contact-adjacent spacer.

BRIEF DESCRIPTION OF THE DRAWINGS

The accompanying drawings, which are incorporated in and constitute a part of this specification, illustrate several embodiments of the present teachings and, together with the description, serve to explain the principles of the present teachings.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
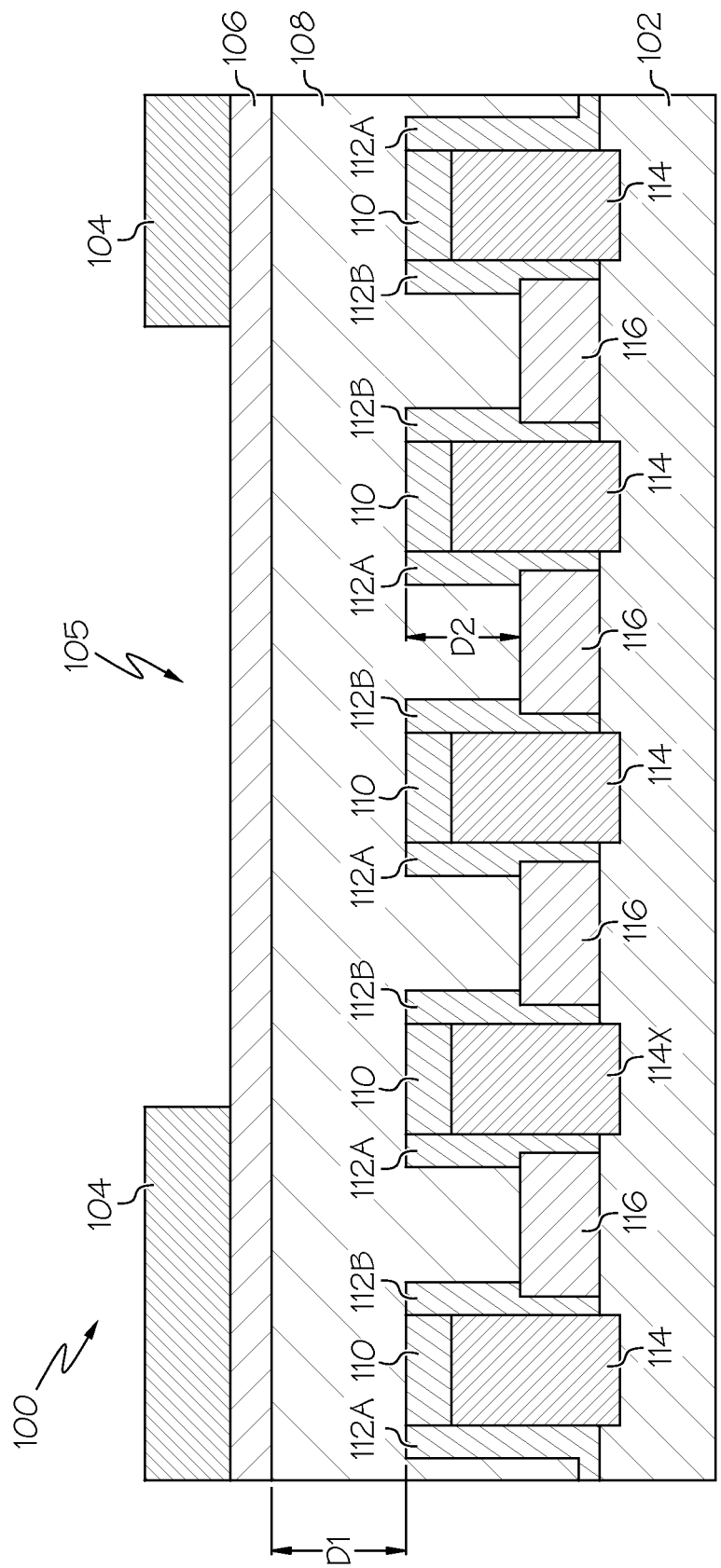

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1 shows a semiconductor structure at a starting point for embodiments of the present invention.

Figure 2:
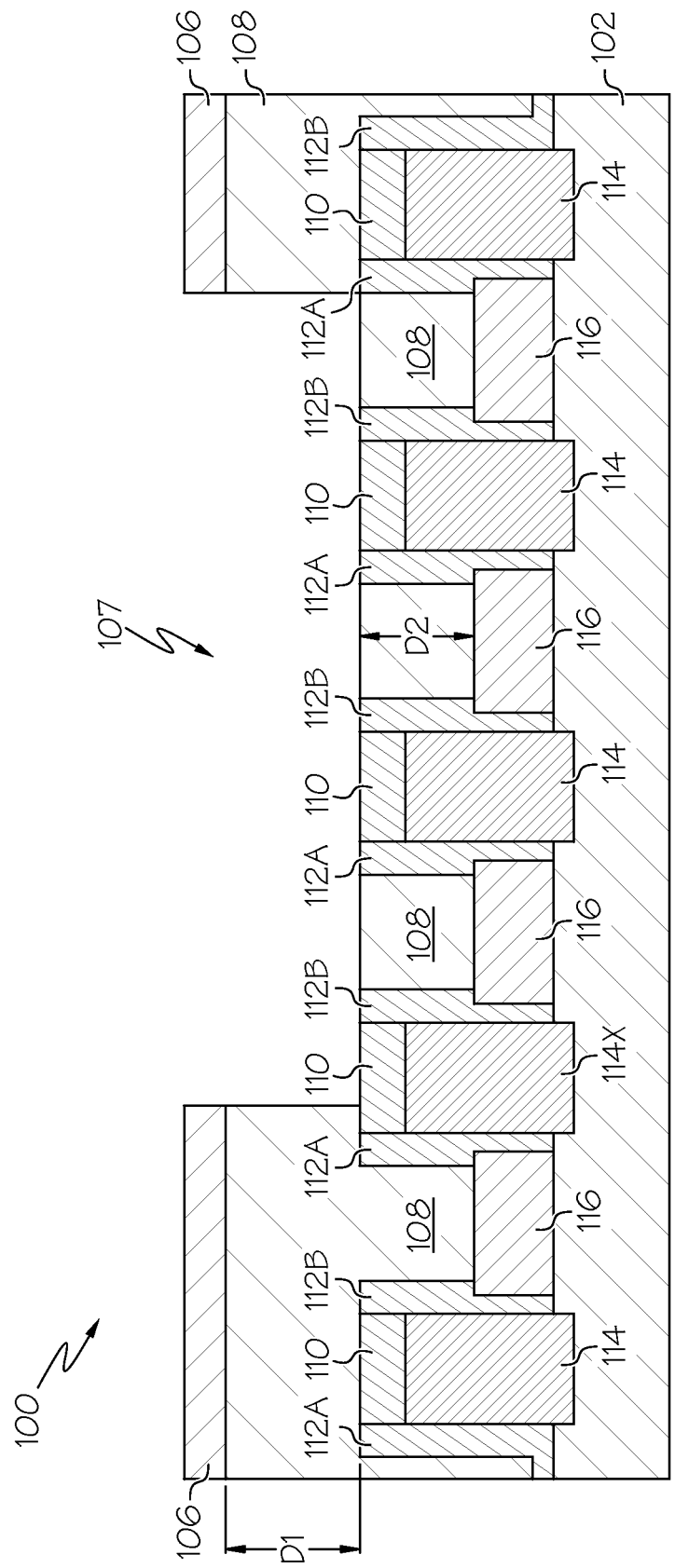

FIG. 2 shows a semiconductor structure after a subsequent process step of performing a first etch, in accordance with embodiments of the present invention.

Figure 3:
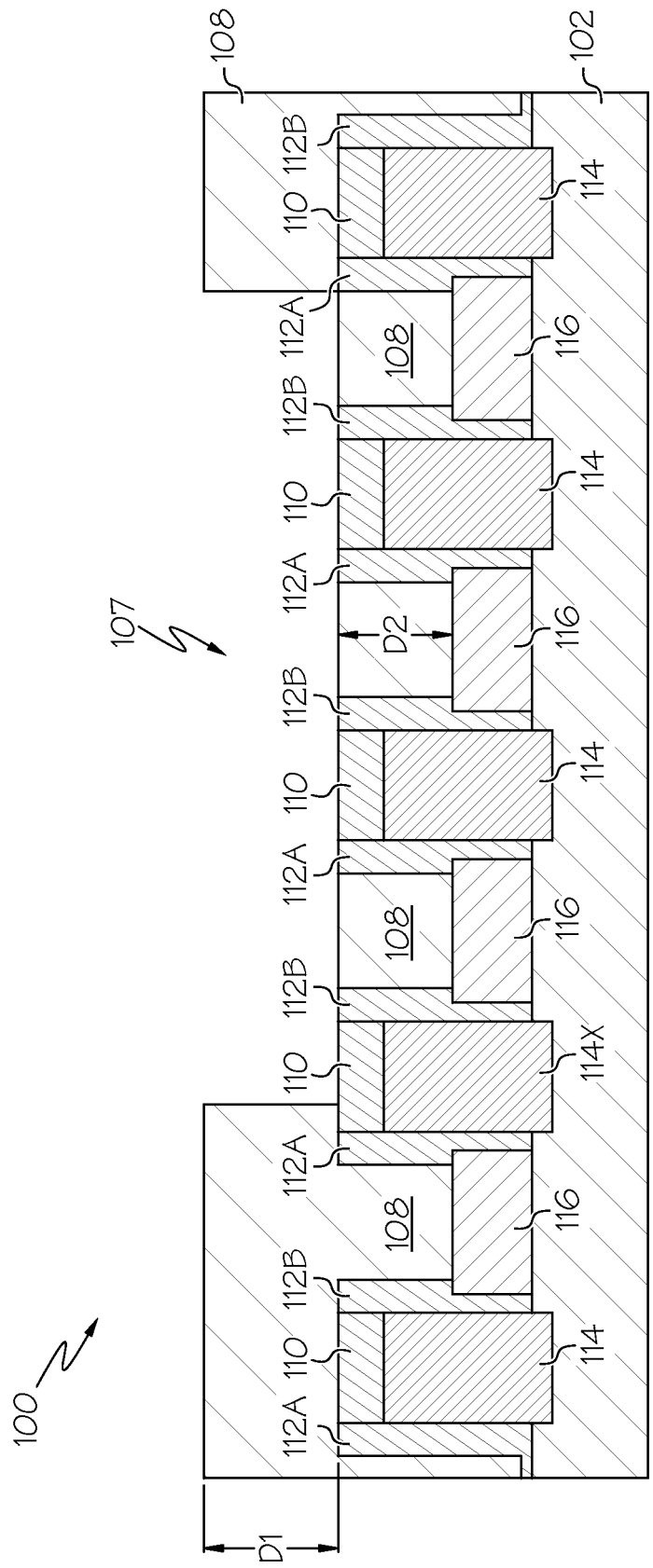

FIG. 3 shows a semiconductor structure after a subsequent process step of removing a mask layer, in accordance with embodiments of the present invention.

Figure 4:
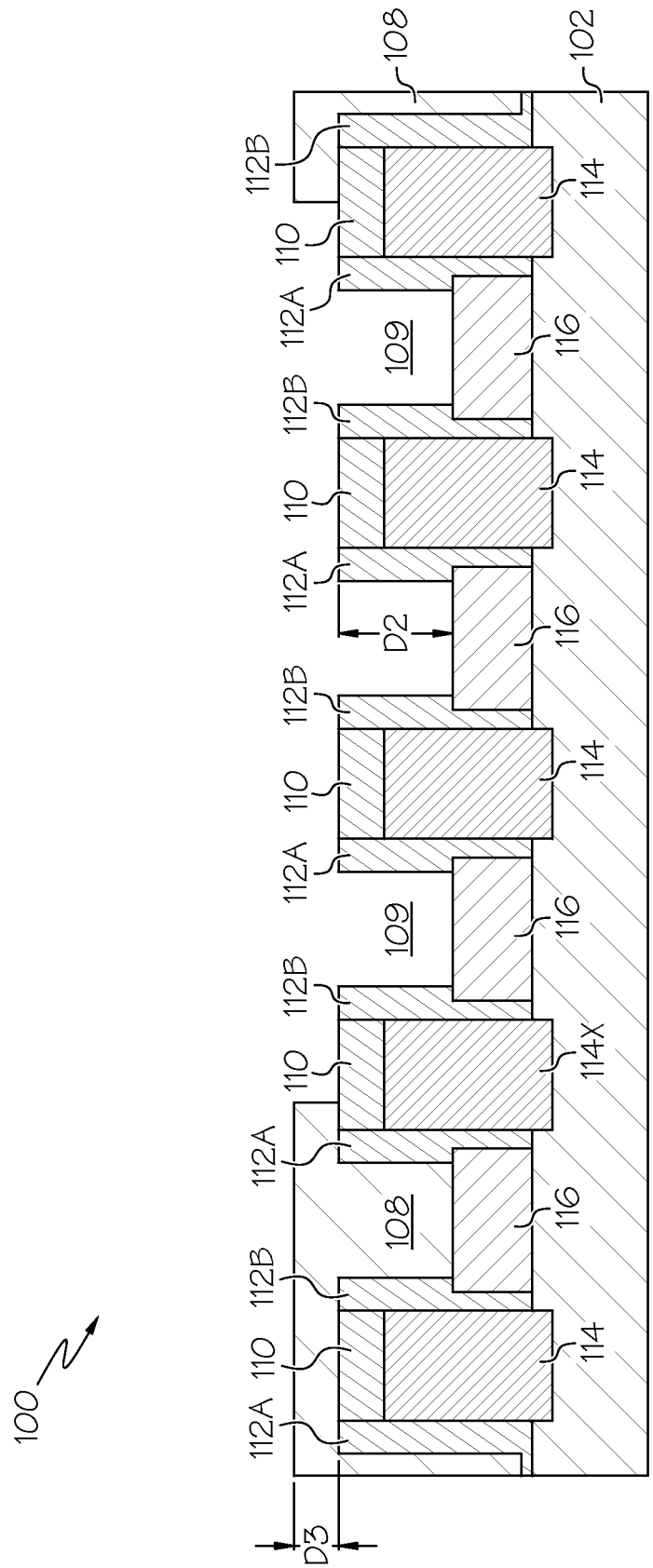

FIG. 4 shows a semiconductor structure after a subsequent process step of performing a second etch, in accordance with embodiments of the present invention.

Figure 5:
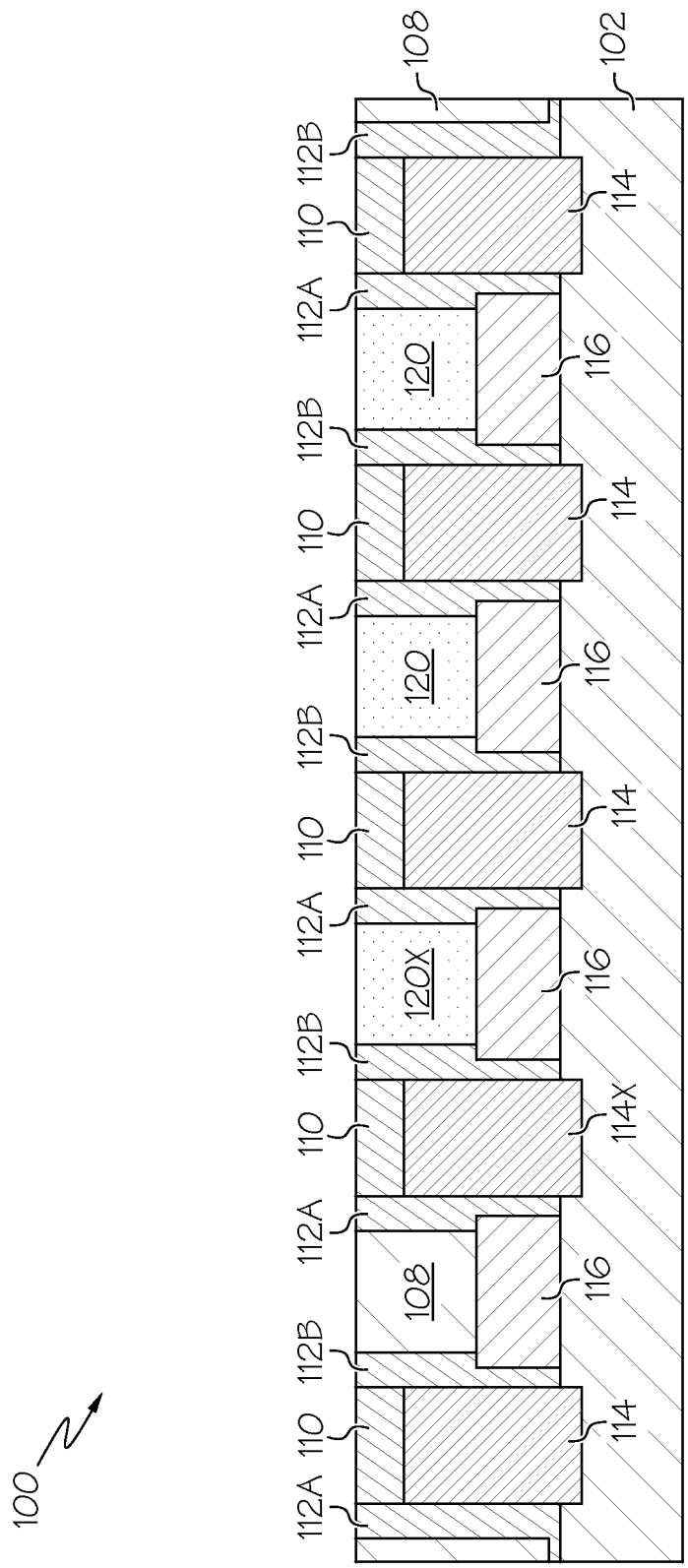

FIG. 5 shows a semiconductor structure after a subsequent process step of performing a metal fill, in accordance with embodiments of the present invention.

Figure 6:
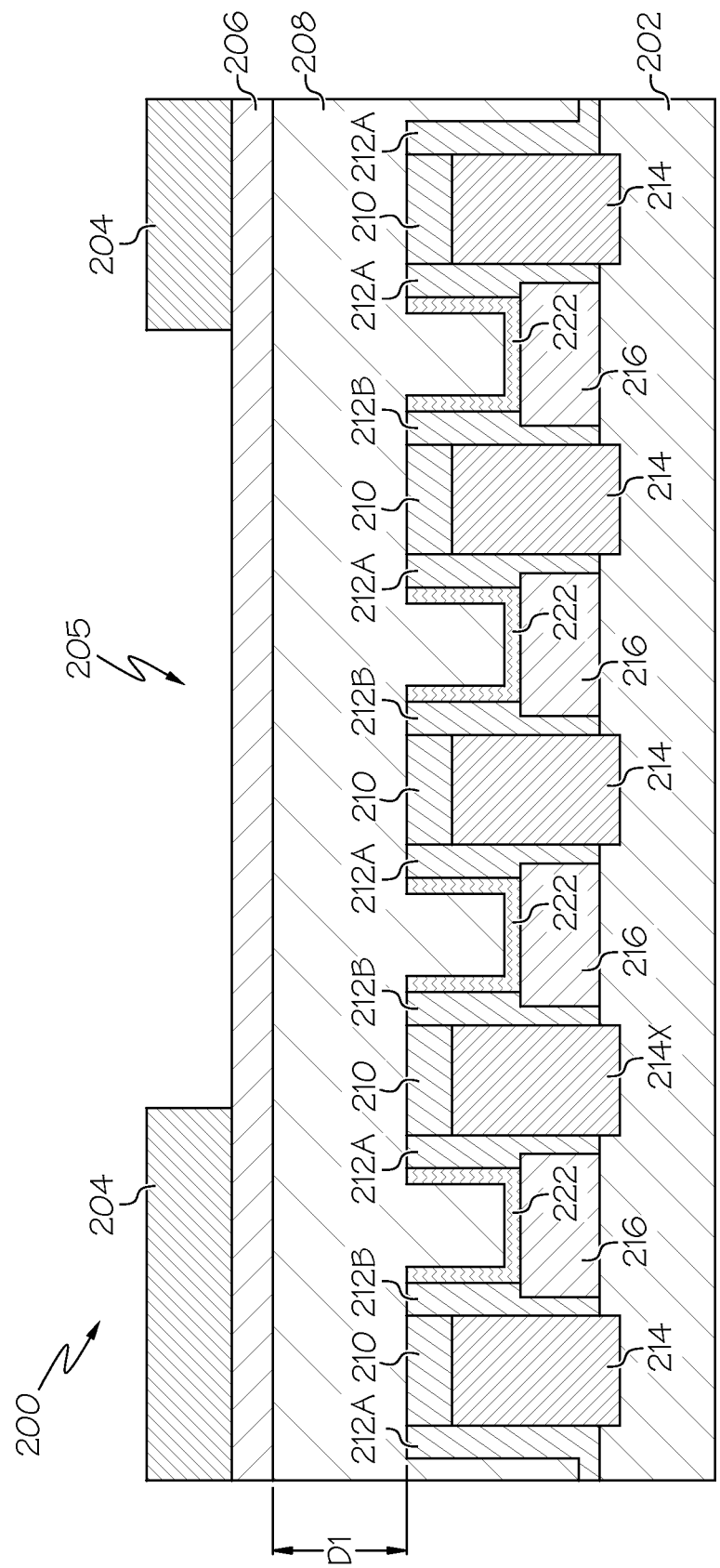

FIG. 6 shows a semiconductor structure at a starting point for alternative embodiments of the present invention.

Figure 7:
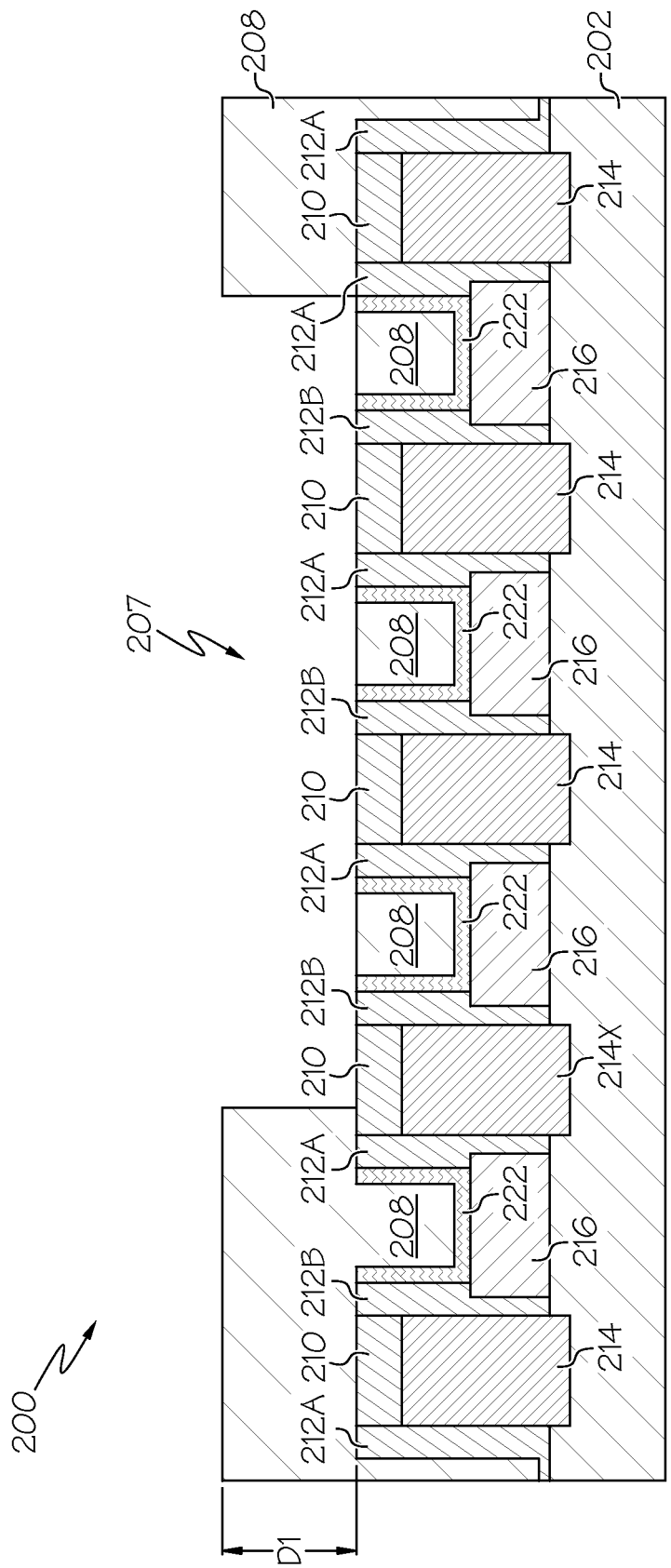

FIG. 7 shows a semiconductor structure after a subsequent process step of performing a first etch, in accordance with alternative embodiments of the present invention.

Figure 8:
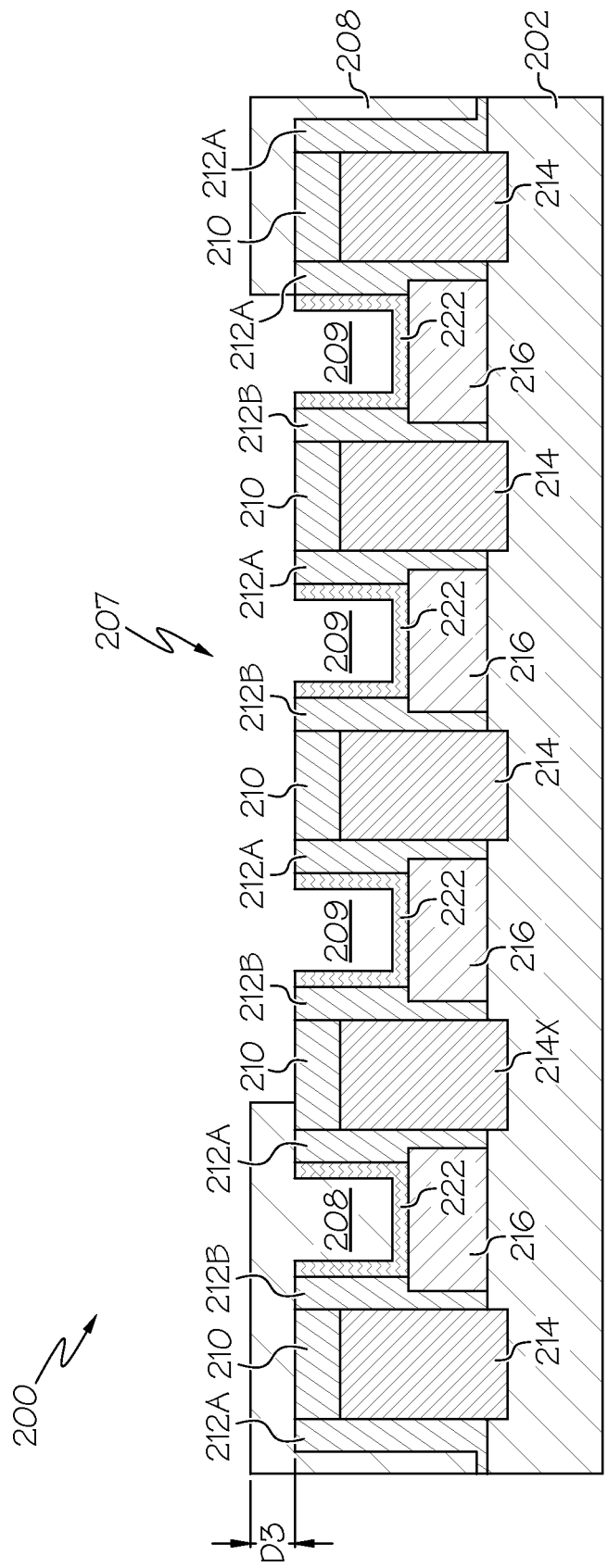

FIG. 8 shows a semiconductor structure after a subsequent process step of performing a second etch, in accordance with alternative embodiments of the present invention.

Figure 9:
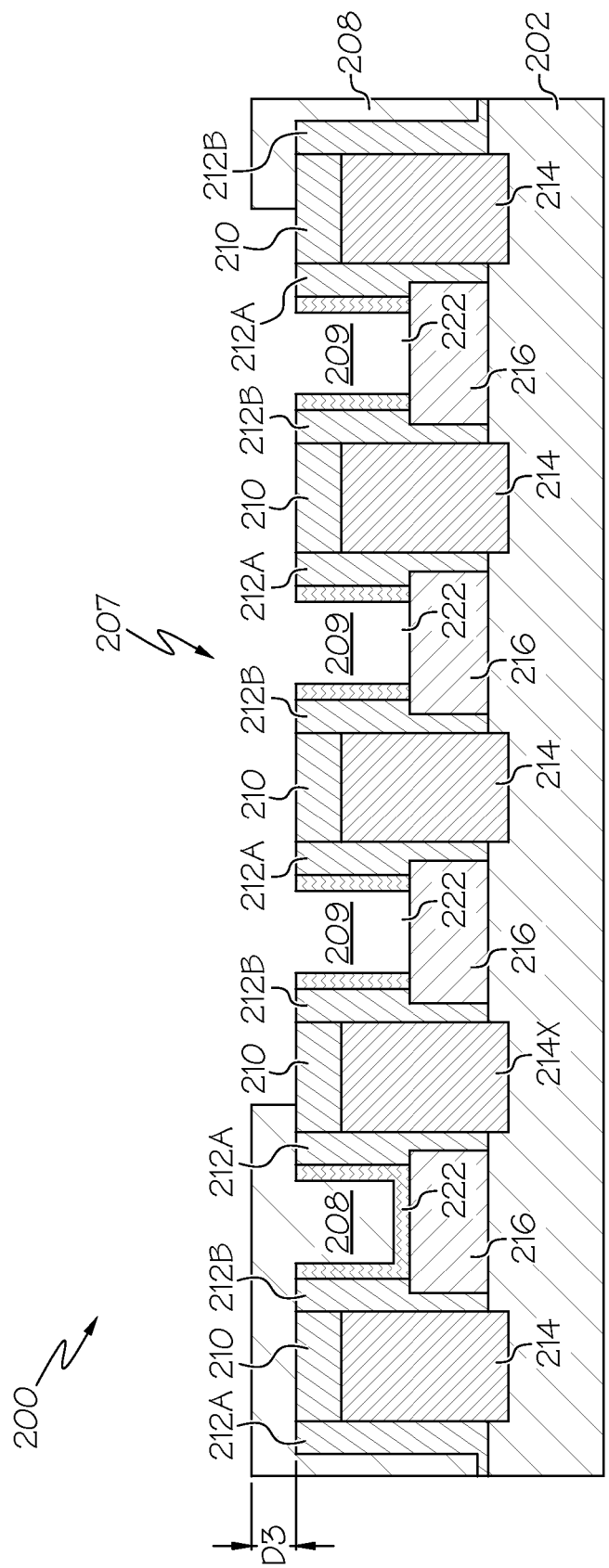

FIG. 9 shows a semiconductor structure after a subsequent process step of performing a third etch.

Figure 10:
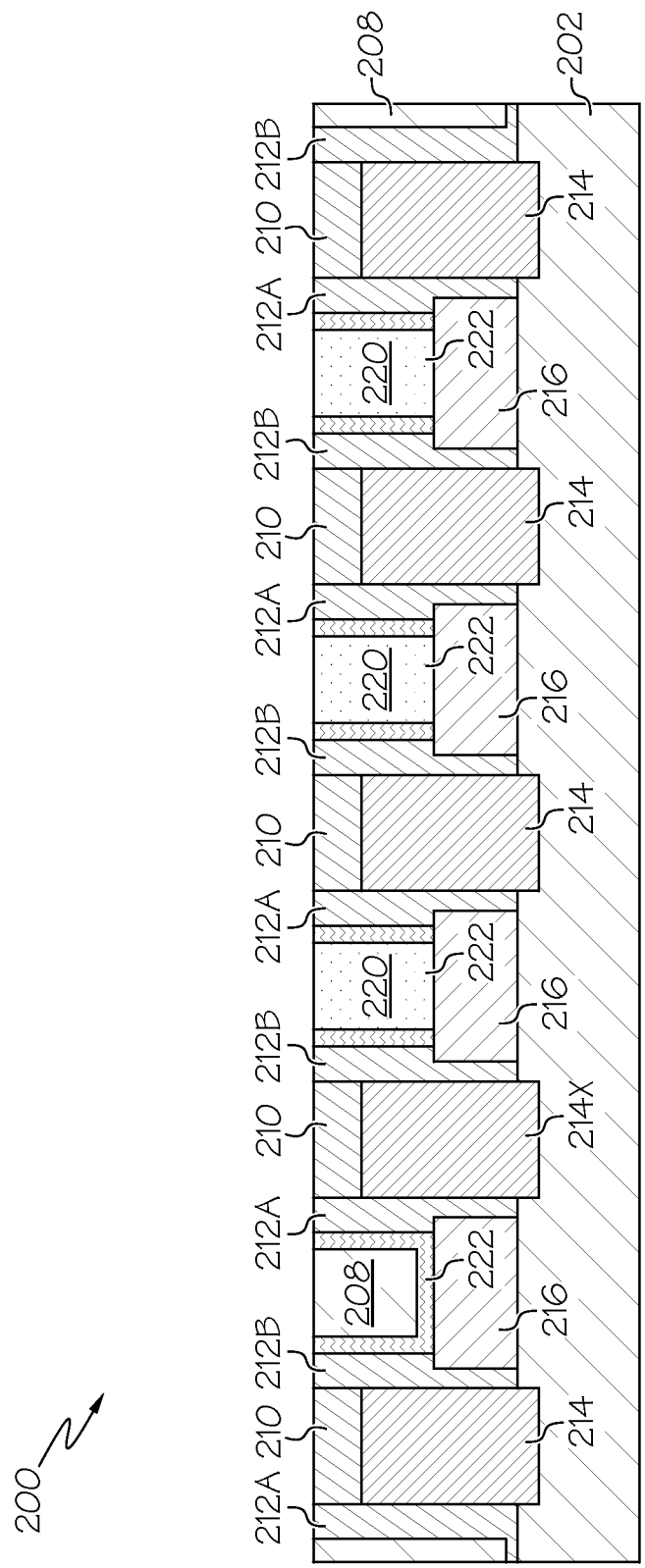

FIG. 10 shows a semiconductor structure after a subsequent process step of performing a metal fill, in accordance with alternative embodiments of the present invention.

Figure 11:
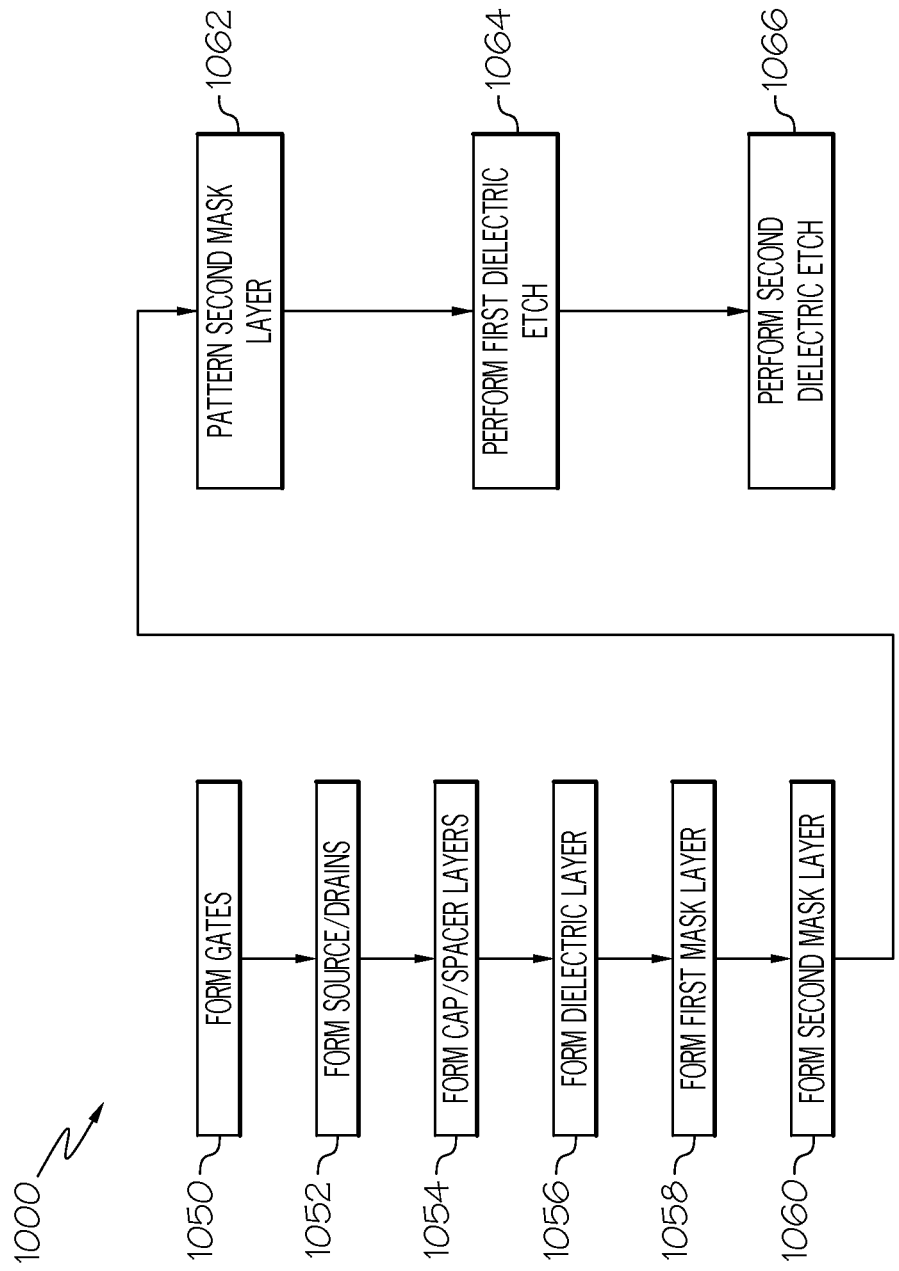

FIG. 11 is a flowchart indicating process steps for illustrative embodiments.

DETAILED DESCRIPTION

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g., a second layer), wherein intervening elements, such as an interface structure (e.g., interface layer), may be present between the first element and the second element.

FIG. 1 shows a semiconductor structure 100 at a starting point for embodiments of the present invention. Semiconductor structure 100 comprises a semiconductor substrate 102. In some embodiments, semiconductor substrate 102 comprises a silicon substrate, such as a bulk silicon wafer. In other embodiments, semiconductor substrate 102 may be a semiconductor-on-insulator (SOI) substrate. A plurality of gates 114 are formed on the semiconductor substrate 102. In embodiments, the gates 114 may be comprised of polysilicon. In other embodiments, the gates 114 may be comprised of metal, and may be formed using a replacement metal gate (RMG) process. A plurality of source/drain regions 116 are formed adjacent to the gates 114. The source/drain regions 116 may serve as a source or drain of a field effect transistor (FET). In embodiments, the source/drain regions 116 may be doped with dopants such as arsenic, phosphorous, boron, or other suitable dopant species. A capping layer 110 is formed over each gate 114. Gate spacers (indicated generally as 112) are formed adjacent to each gate 114. There is a spacer on each side of a gate (see spacer 112A and 112B on each side of gate 114X). In embodiments, the capping layer 110 and the spacers 112 are comprised of a nitride layer, such as silicon nitride (SiN). A dielectric layer 108 is deposited over the semiconductor structure. In embodiments, the dielectric layer 108 is comprised of an oxide, such as silicon oxide. In embodiments, a flowable oxide is used. The oxide may be deposited using a chemical vapor deposition (CVD) process. In embodiments, a self-planarizing oxide is used for dielectric layer 108. The dielectric layer 108 is deposited such that it has a depth D1 from the top of the dielectric layer 108 to the top of the capping layer 110, and depth D1 is greater than the depth D2, which is from the top of the capping layer 110 to the top of the source/drain region 116. In some embodiments, depth D1 ranges from about 70 nanometers to about 120 nanometers, and depth D2 ranges from about 40 nanometers to about 65 nanometers. A first mask layer 106 is formed on the dielectric layer 108. A second mask layer 104 is deposited on the first mask layer 106. The second mask layer is patterned (using industry-standard patterning techniques) to form a void 105 which exposes a portion of the first mask layer 106. In embodiments, the first mask layer 106 and second mask layer 104 are comprised of hardmasks. The first mask layer 106 and second mask layer 104 may be comprised of different materials that are selectively etchable to each other. In embodiments, the first mask layer 106 may be comprised of SiCON.

FIG. 2 shows semiconductor structure 100 after a subsequent process step of performing a first etch, in accordance with embodiments of the present invention. As a result of the first etch, a recess 107 is formed. The recess 107 has a depth D1, and the dielectric layer 108 has a depth of D2, such that the dielectric layer is recessed to about the level of the top of the capping layer 110. In some embodiments, the dielectric layer 108 may be recessed to a level slightly above or below the level of the top of capping layer 110. For example, in some embodiments, the dielectric layer 108 may be recessed to a level ranging from 10 nanometers above the top of the capping layer 110, to a level of 10 nanometers below the top of capping layer 110. The second mask layer (104 of FIG. 1) is then removed. In embodiments, the second mask layer (104) is comprised of a carbon-containing material, and is removed with an oxygen ashing process.

In embodiments, the first etch is a reactive ion etch (RIE). In some embodiments, the first etch is a continuous wave reactive ion etch. In some embodiments, the first etch is a pulsed plasma reactive ion etch. The use of pulsed plasma discharges adds flexibility to effectively widen the process parameter window of conditions for stable plasma operation. For example, pulsed plasmas improve control of key plasma characteristics, including ion energy and angular distributions, electron temperature, and radical-to-ion flux ratio. Also, by virtue of pulsing, additional process control parameters, such as pulse frequency and pulse duty cycle, are acquired. In particular, the application of time-modulated discharges to source/drain (S/D) contact formation for 3D-FinFET architectures is beneficial in addressing challenging selectivity, aspect ratio (AR) and critical pitch requirements encountered during corresponding process development. The applied bias pulsing technique modulates the degree of sidewall polymer passivation (SWP) via discrete/dynamic control of average RF power delivered to the bias platen located in the discharge system of the RIE tool. This control over the average amount of RF bias input power directly affects the flux ratio of critical etching (mainly ionic species) and polymerizing species (i.e. radical species) to the reacting surface interface. The amount of SWP during reactive ion etches is modulated by the aforementioned ratio. The sidewall passivation balance, in turn, influences the effective lateral and vertical etch rates during treatment, thus allowing for various degrees of anisotropic etching over a wide range of materials, many times arranged in complex layered interfaces. By dynamically modulating the effective degree of SWP, embodiments of the present invention utilize high selectivity regimes during RIE processing that would otherwise remain out of reach with conventional/traditional RIE methods while avoiding unwanted etch stop marginality.

FIG. 3 shows semiconductor structure 100 after a subsequent process step of removing the first mask layer (see 106 of FIG. 1), in accordance with embodiments of the present invention. In embodiments, the first mask layer is removed using a fluorine or chlorine based etch process.

FIG. 4 shows semiconductor structure 100 after a subsequent process step of performing a second etch, in accordance with embodiments of the present invention. In some embodiments, the second etch comprises a dry etch. In some embodiments, the second etch comprises a wet etch. In some embodiments, the second etch includes bias pulsing. In other embodiments, the second etch includes the use of hydrofluoric acid. In yet other embodiments, the second etch includes the use of a SiCoNi process. The SiCoNi process can remove silicon oxide with very good selectivity to silicon nitride. As a result of the second etch, cavities 109 are formed between each gate 114, exposing the source/drain regions 116, which enables placement of contacts on the source/drain regions. The second etch is fine tuned to be highly selective to the material used for spacers 112, as to not damage the spacers. A RIE process is not completely selective, and could damage the spacers. Damage of the spacers can affect device performance, and in some cases, lead to non-functioning devices. Therefore, it is desirable to preserve the spacers 112 during the process of opening (exposing) the source/drain regions 116 (i.e., in the case of gate 114X, where spacer 112A is on one side, and still covered by dielectric layer 108, and spacer 112B is adjacent to cavity 109). In a prior art process, the RIE etch would damage spacer 112B so it would not be similar to spacer 112A. In embodiments of the present invention, the use of the second etch prevents damage to spacer 112B, such that it remains similar to spacer 112A which is covered by dielectric layer 108. As a result of the second etch, the amount of dielectric disposed above the capping layer 110 is reduced to a depth D3. In embodiments, depth D3 may range from about 10 nanometers to about 25 nanometers.

FIG. 5 shows semiconductor structure 100 after a subsequent process step of performing a metal fill, in accordance with embodiments of the present invention. Contact regions 120 are comprised of a metal deposited in cavities 109 (FIG. 4). In embodiments, the contact regions 120 are comprised of tungsten. In other embodiments, the contact regions 120 are comprised of aluminum or copper. Following the deposition of the material for contact region 120, a planarization process may be used to make the contact regions 120 flush with the top of the capping layer 110. In embodiments, the planarization process is a chemical mechanical polish (CMP) process. Referring now to transistor gate 114X, spacer 112B is a contact-adjacent spacer, being adjacent to contact 120X. Spacer 112A is a non-contact-adjacent spacer, as there is no contact directly next to spacer 112A. Because the contact-adjacent spacer 112B was not damaged during the second etch process (as it would have been with a RIE), the contact-adjacent spacer 112B has the same shape as the non-contact-adjacent spacer 112A. In some embodiments (as shown in FIG. 5), the contact 120X is in direct physical contact with contact-adjacent spacer 112B.

FIG. 6 shows a semiconductor structure 200 at a starting point for alternative embodiments of the present invention. Semiconductor structure 200 is similar to semiconductor structure 100 as shown in FIG. 1, with the significant difference being the use of a contact etch stop layer (CESL) 222 over each source/drain region 216. In embodiments, the CESL 222 is comprised of a nitride, such as silicon nitride. As stated previously, similar elements may be referred to by similar numbers in various figures (FIGs) of the drawing, in which case typically the last two significant digits may be the same. For example, semiconductor substrate 202 of FIG. 2 is similar to semiconductor substrate 102 of FIG. 1.

FIG. 7 shows semiconductor structure 200 after a subsequent process step of performing a first etch, in accordance with alternative embodiments of the present invention. As a result of the first etch, a recess 207 is formed. The recess 207 has a depth of D1, and the dielectric layer 208 has a depth of D2, such that the dielectric layer is recessed to about the level of the top of the capping layer 210. The second mask layer (204 of FIG. 6) is then removed. In embodiments, the second mask layer (204) is comprised of a carbon-containing material, and is removed with an oxygen ashing process. In embodiments, the first etch is a reactive ion etch (RIE) as previously described. The first mask layer 204 and second mask layer 206 are then removed as described previously.

FIG. 8 shows semiconductor structure 200 after a subsequent process step of performing a second etch, in accordance with alternative embodiments of the present invention. In some embodiments, the second etch comprises a dry etch. In some embodiments, the second etch comprises a wet etch. In some embodiments, the second etch includes bias pulsing. In other embodiments, the second etch includes the use of hydrofluoric acid. In yet other embodiments, the second etch includes the use of a SiCoNi process. The SiCoNi process can remove silicon oxide with very good selectivity to silicon nitride. As a result of the second etch, cavities 208 are formed which expose the CESL layer 222. As a result of the second etch, the amount of dielectric disposed above the capping layer 210 is reduced to a depth D3. In embodiments, depth D3 may range from about 10 nanometers to about 25 nanometers.

FIG. 9 shows semiconductor structure 200 after a subsequent process step of performing a third etch, in accordance with alternative embodiments of the present invention. The third etch is used to remove at least a portion of CESL 222 to expose the source/drain regions 216. The CESL 222 may still remain on the sidewalls of cavities 209, depending on the type of etch used to remove the CESL. If an anisotropic etch is used for the third etch, then a portion of the CESL 222 may remain on the sidewalls as shown in FIG. 9. If an isotropic etch is used for the third etch, then the entire CESL 222 may be removed. The CESL provides additional etch control to reduce the risk of damage to the source/drain regions during the etch process. Hence, in this embodiment, the spacers and the source/drain regions are preserved during the etch process. For example, in the case of gate 214X, where spacer 212A is on one side, and still covered by dielectric layer 208, and similar spacer 212B is adjacent to cavity 209. In a prior art process, the RIE etch would damage spacer 212B so it would not be similar to spacer 212A. In embodiments of the present invention, the use of the second etch prevents damage to spacer 212B, such that it remains similar to spacer 212A, which is covered by dielectric layer 208. In embodiments, the third etch may be a selective reactive ion etch, SiCoNi etch, or other suitable process.

FIG. 10 shows semiconductor structure 200 after a subsequent process step of performing a metal fill, in accordance with alternative embodiments of the present invention. Contact regions 220 are comprised of a metal deposited in cavities 209 (FIG. 9). In embodiments, the contact regions 220 are comprised of tungsten. In other embodiments, the contact regions 220 are comprised of aluminum or copper. Following the deposition of the material for contact region 220, a planarization process may be used to make the contact regions 220 flush with the top of the capping layer 210. In embodiments, the planarization process is a chemical mechanical polish (CMP) process.

FIG. 11 is a flowchart 1000 indicating process steps for illustrative embodiments. In process step 1050, a plurality of transistor gates are formed. In process step 1052, a plurality of source/drain regions are formed. In process step 1054, capping layers and spacer layers are formed. In process step 1056, a dielectric layer is formed over the semiconductor structure (see 108 of FIG. 1). In process step 1058, a first mask layer is formed over the semiconductor structure (see 106 of FIG. 1). In process step 1060, a second mask layer is formed over the semiconductor structure (see 104 of FIG. 1). In process step 1062, the second mask layer is patterned to form an opening (see 105 of FIG. 1). In process step 1064, a first dielectric etch is performed to form a partial recess in the dielectric layer. The first dielectric etch may be an anisotropic etch, and, in embodiments, may include a reactive ion etch (RIE). In process step 1066, a second dielectric etch is performed. The second dielectric etch may be a wet etch or a dry etch. The second dielectric etch is highly selective to the spacer material as to not damage it, thereby preserving the spacers during the opening of the source/drain regions. Note that while flowchart 1000 depicts a particular order, in some embodiments, the order of the steps may be different. For example, the source/drain regions may be formed before the gates are formed.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method of forming a semiconductor structure, comprising:
   forming a plurality of gates on a semiconductor substrate;
   forming a plurality of source/drain regions adjacent to the plurality of gates;
   forming a nitride layer over the plurality of gates, wherein the nitride layer is not in contact with the plurality of source/drain regions;
   forming a dielectric layer over the nitride layer;
   forming a first mask layer on the dielectric layer;
   forming a second mask layer on the first mask layer;
   patterning the second mask layer;
   performing an etch of the first mask layer;
   performing a first etch of the dielectric layer to a level above the source/drain regions; and
   performing a second etch of the dielectric layer to expose the source/drain regions.

2. The method of claim 1, wherein forming a dielectric layer comprises forming an oxide layer.

3. The method of claim 1, wherein performing the first etch comprises performing a reactive ion etch.

4. The method of claim 3, wherein performing the reactive ion etch comprises performing a continuous wave reactive ion etch.

5. The method of claim 3, wherein performing the reactive ion etch comprises performing a pulsed plasma reactive ion etch.

6. The method of claim 1, wherein performing the second etch comprises performing a dry etch.

7. The method of claim 1, wherein performing the second etch includes bias pulsing.

8. The method of claim 1, wherein performing the second etch comprises performing a wet etch.

9. The method of claim 8, wherein performing the wet etch includes using hydrofluoric acid.

10. The method of claim 1, wherein performing the second etch includes using a SiCoNi process.

11. The method of claim 1, wherein performing the first etch comprises etching to a level of a top of the nitride layer on the plurality of gates.

12. A method of forming a semiconductor structure, comprising:
    forming a plurality of gates on a semiconductor substrate;
    forming a plurality of source/drain regions adjacent to the plurality of gates;
    forming a nitride layer over the plurality of gates, wherein the nitride layer is not in contact with the plurality of source/drain regions;
    forming a contact etch stop layer over the source/drain regions;
    forming a dielectric layer over the nitride layer;
    forming a first mask layer on the dielectric layer;
    forming a second mask layer on the first mask layer;
    patterning the second mask layer;
    performing an etch of the first mask layer;
    performing a first etch of the dielectric layer to a level above the source/drain regions;
    performing a second etch of the dielectric layer to expose the contact etch stop layer; and
    performing a third etch to expose the source/drain regions.

13. The method of claim 12, wherein forming a dielectric layer comprises forming an oxide layer.

14. The method of claim 12, wherein performing the first etch comprises performing a reactive ion etch.

15. The method of claim 12, wherein performing the second etch comprises performing a dry etch.

16. The method of claim 12, wherein performing the second etch includes bias pulsing.

17. The method of claim 12, wherein performing the second etch comprises performing a wet etch.

* * * * *